United States Patent
Cheng et al.

(10) Patent No.: US 9,825,387 B2
(45) Date of Patent: Nov. 21, 2017

(54) LINEAR EDGE CONNECTOR WITH A CABLE RETENTION MECHANISM HAVING A BODY WITH A GROOVE WITH AN INDENTATION TO RECEIVE A BOLSTER PLATE PROTRUSION

(71) Applicant: Intel Corporation, Santa Clara, CA (US)

(72) Inventors: Feifei Cheng, Chandler, AZ (US); Kuang C. Liu, Queen Creek, AZ (US); Michael Garcia, Mesa, AZ (US); Eric W. Buddrius, DuPont, WA (US); Kevin J. Ceurter, Olympia, WA (US); Jonathon Robert Carstens, Lacey, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/084,726

(22) Filed: Mar. 30, 2016

(65) Prior Publication Data
US 2017/0288331 A1 Oct. 5, 2017

(51) Int. Cl.
*H01R 13/62* (2006.01)
*H01R 12/75* (2011.01)
(Continued)

(52) U.S. Cl.
CPC ......... *H01R 12/75* (2013.01); *H01R 12/7023* (2013.01); *H01R 13/639* (2013.01)

(58) Field of Classification Search
CPC ........ H01R 4/50; H01R 13/62; H01R 13/625; H01R 13/6276; H01R 13/639;
(Continued)

(56) References Cited

U.S. PATENT DOCUMENTS 6,383,000 B1 * 5/2002 Burd, Jr. ................ H01R 39/10
439/192
6,415,168 B1 * 7/2002 Putz .......................... A61N 1/05
439/909

(Continued)

FOREIGN PATENT DOCUMENTS

JP 2005189684 A 7/2005
WO 2014123730 A1 8/2014

OTHER PUBLICATIONS

International Search Report and Written Opinion issued in International Application No. PCT/US2017/020023 dated Jun. 7, 2017; 13 pages.

(Continued)

*Primary Examiner* — Chandrika Prasad
(74) *Attorney, Agent, or Firm* — Patent Capital Group

(57) ABSTRACT

Embodiments of the present disclosure are directed to a linear edge connector assembly and corresponding bolster plate features for receiving and securing a linear edge connector assembly. Embodiments of the disclosure are directed to a linear edge connector assembly that includes a grooved and indented receiver that can receive a spring loaded ball on the bolster plate. In embodiments, the linear edge connector assembly can include a magnetic element to create a magnetic attraction to magnetic elements on the bolster plate, such as a press-fit ball or a U-shaped hardstop. In some embodiments, the linear edge connector assembly includes a screw or push pin that can be received by a receiver on the bolster plate. The receiver can include a thread or friction fit receiver.

17 Claims, 16 Drawing Sheets

(51) Int. Cl.
*H01R 12/70* (2011.01)
*H01R 13/639* (2006.01)

(58) Field of Classification Search
CPC ............ H01R 13/4361; H01R 12/7005; H01R 12/7011; H01R 12/7017; H01R 12/7023; H01R 12/7029; H01R 12/75; H01R 13/6392
USPC .......................... 439/78, 347, 348, 299, 370
See application file for complete search history.

(56) References Cited

U.S. PATENT DOCUMENTS

| | | | | |
|---|---|---|---|---|
| 6,830,472 | B1* | 12/2004 | Wu | H01R 13/6275 |
| | | | | 439/352 |
| 7,189,098 | B1* | 3/2007 | Wu | H01R 13/405 |
| | | | | 439/206 |
| 7,367,823 | B2* | 5/2008 | Rapp | G02B 6/4453 |
| | | | | 439/137 |
| 7,467,948 | B2* | 12/2008 | Lindberg | H01R 13/6205 |
| | | | | 439/38 |
| 7,762,817 | B2* | 7/2010 | Ligtenberg | H01R 13/74 |
| | | | | 439/38 |
| 2003/0198026 | A1 | 10/2003 | Bui | |
| 2004/0132331 | A1* | 7/2004 | Osborn | H01L 23/4006 |
| | | | | 439/485 |
| 2005/0020121 | A1 | 1/2005 | Lin et al. | |
| 2008/0232758 | A1 | 9/2008 | Miyoshi et al. | |
| 2013/0188325 | A1 | 7/2013 | Garman et al. | |
| 2015/0288117 | A1 | 10/2015 | Yeh | |
| 2015/0311635 | A1 | 10/2015 | Yeh | |
| 2015/0357751 | A1 | 12/2015 | Gao et al. | |

OTHER PUBLICATIONS

International Search Report and Written Opinion issued in International Application No. PCT/US2017/020002 dated Aug. 18, 2017; 12 pages.

* cited by examiner

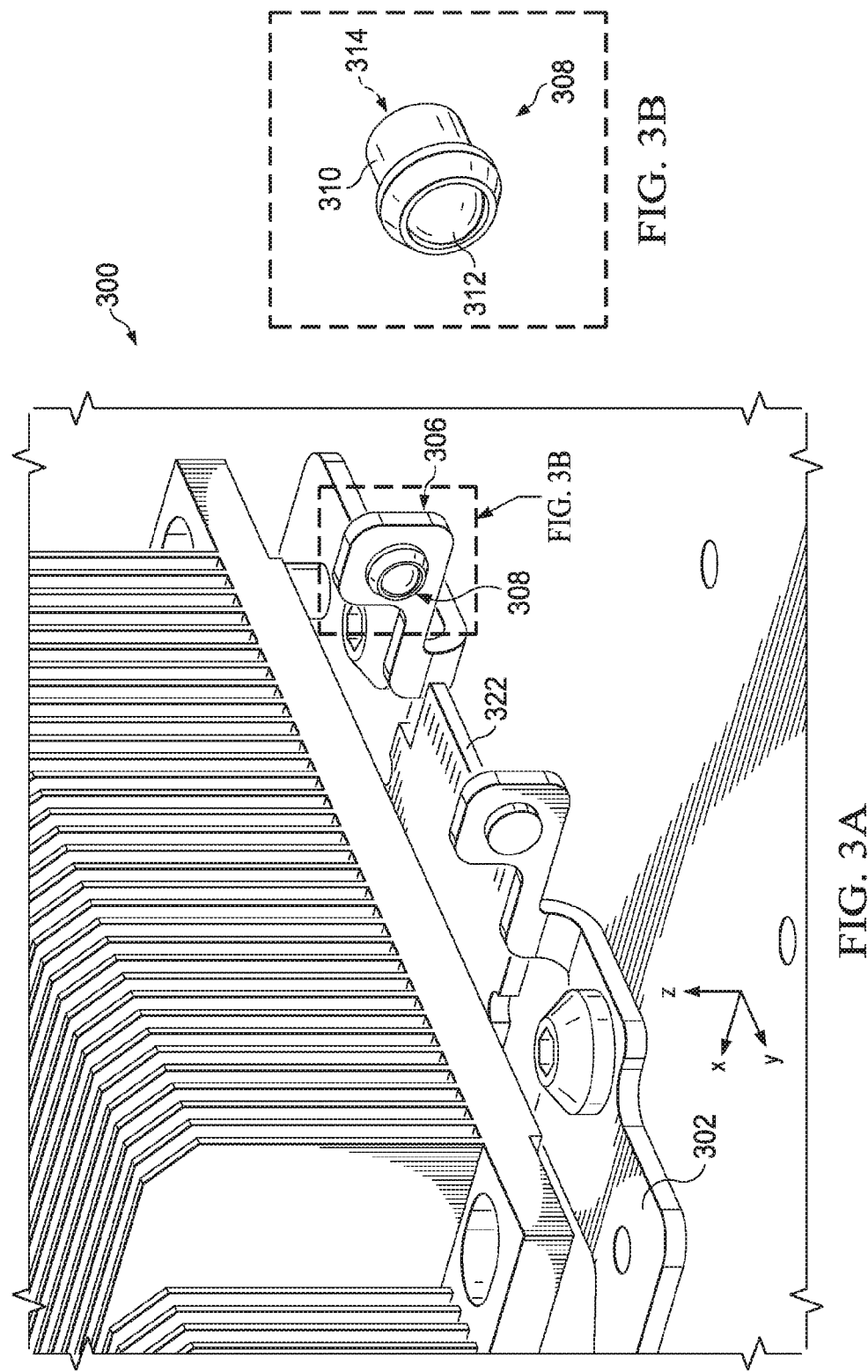

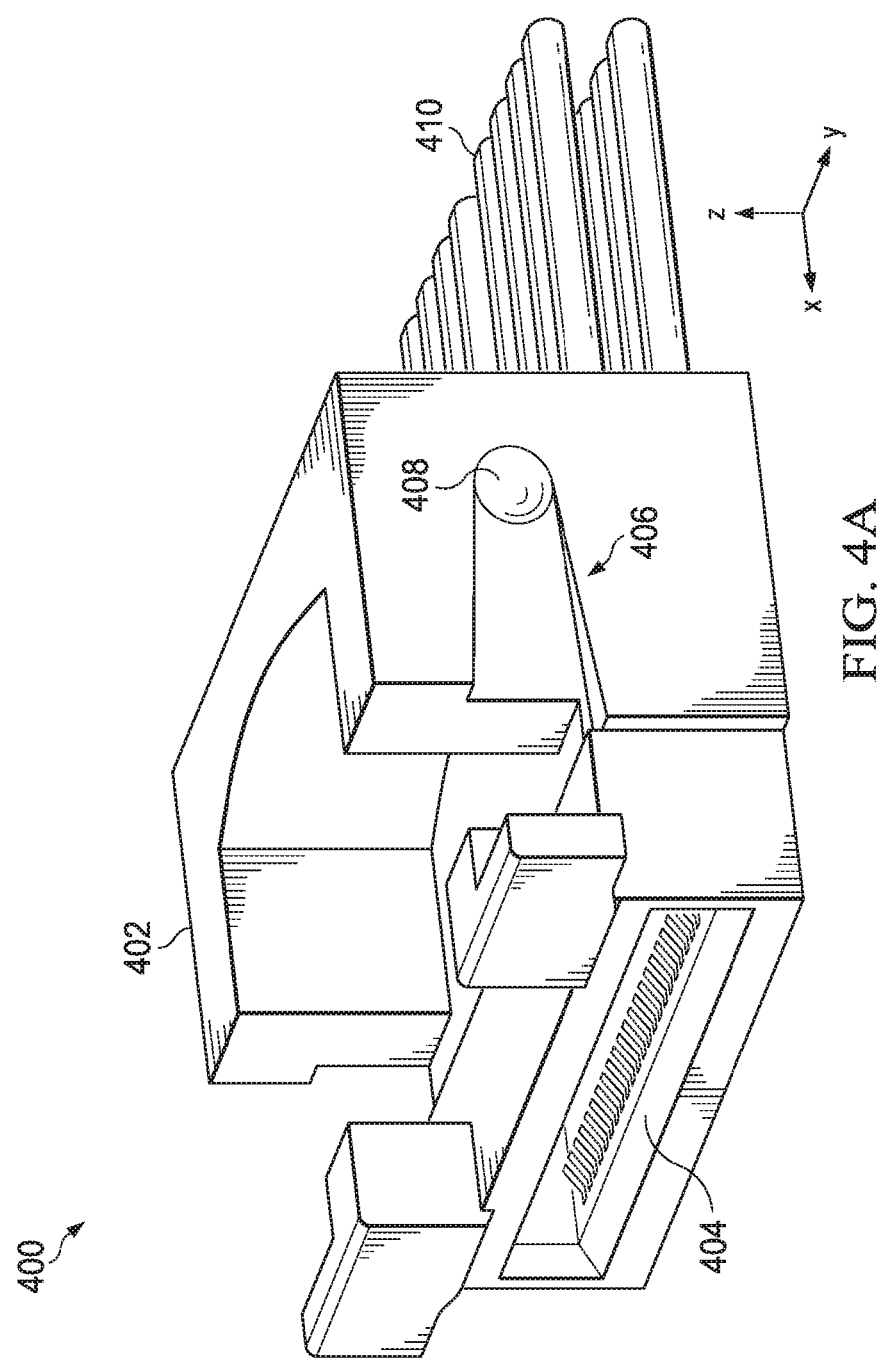

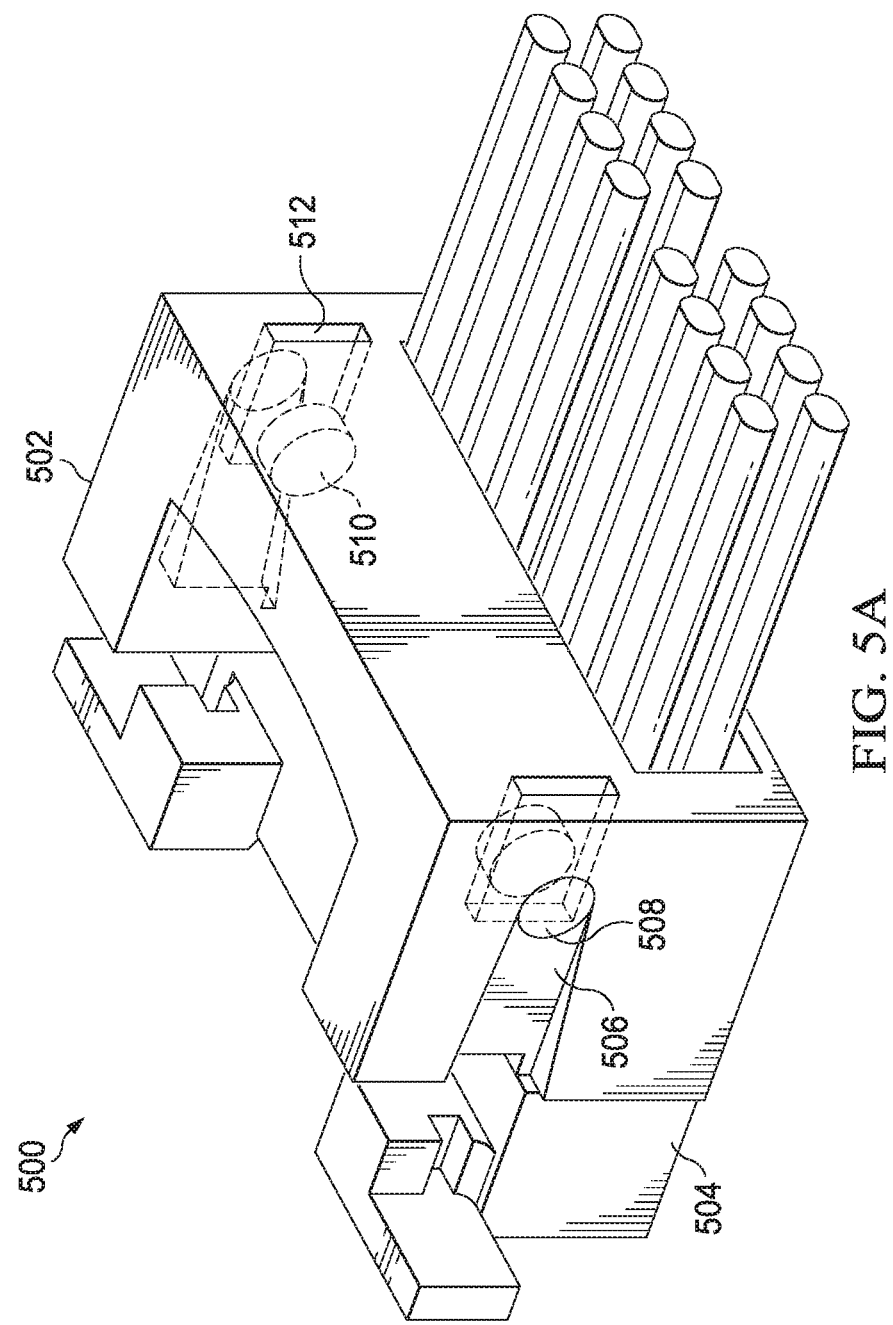

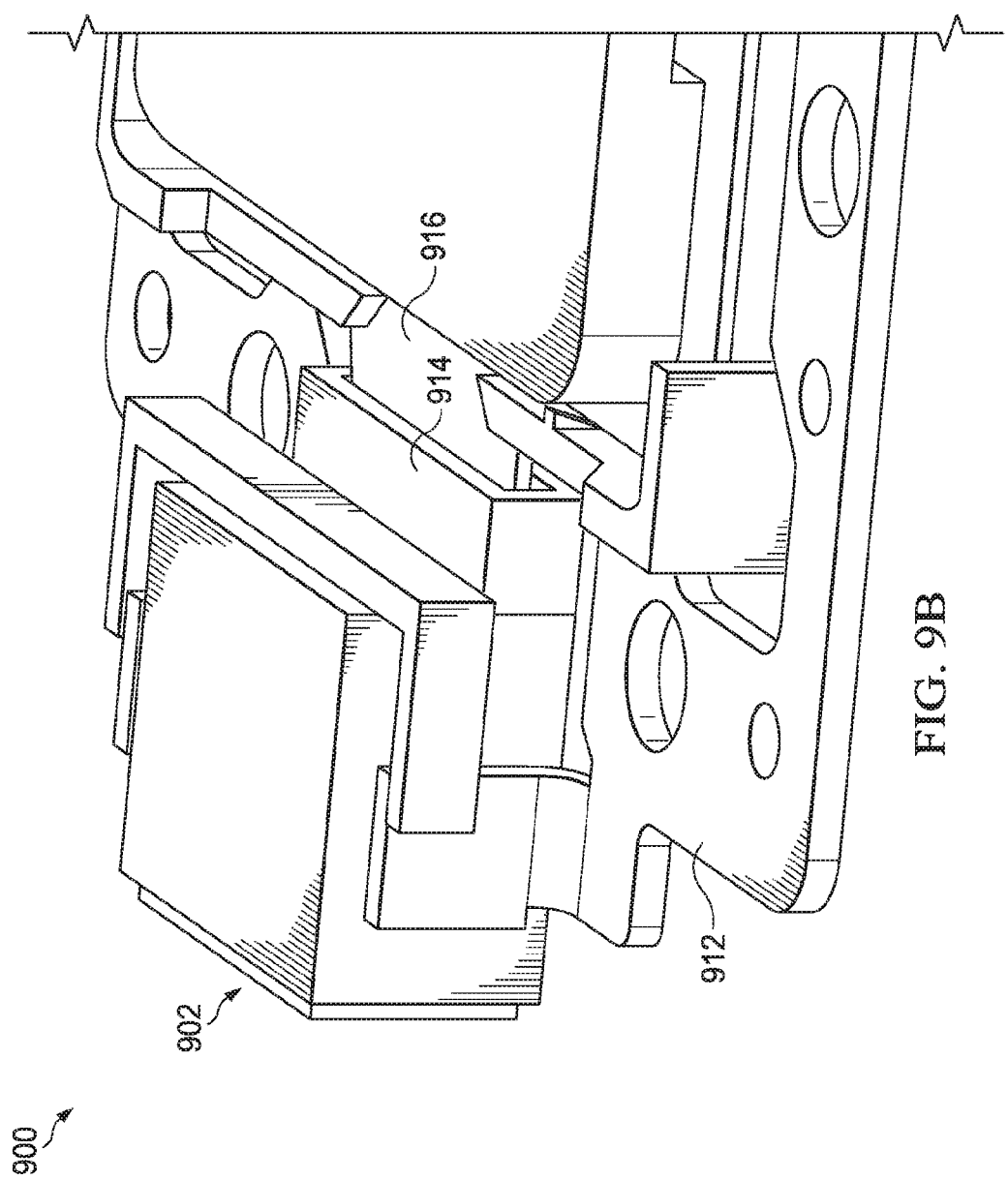

LINEAR EDGE CONNECTOR WITH A CABLE RETENTION MECHANISM HAVING A BODY WITH A GROOVE WITH AN INDENTATION TO RECEIVE A BOLSTER PLATE PROTRUSION

TECHNICAL FIELD

This disclosure pertains to linear edge connector retention mechanisms.

BACKGROUND

Linear Edge Connectors (LEC) are part of an Internal Faceplate-to-Processor (IFP) internal cable which enables high speed, low loss data direct connection from a processor to an fabric network. On one end of the IFP cable can be a 54-ball LEC that connects to a processor package. On the other end of the IFP cable, two 28-pins plugs can mate to Internal Faceplate Transition Connector (IFT connector).

The inherent nature of direct connection to a CPU board for LEC determines its fine contact pitch and tight tolerance, which differentiate LEC from other available edge connectors.

BRIEF DESCRIPTION OF THE DRAWINGS

FIG. 3A is a perspective view of a schematic diagram of a bolster plate in accordance with embodiments of the present disclosure.

FIG. 3B is a close-up view of a bolster plate protrusion in accordance with embodiments of the present disclosure.

FIG. 4A is a perspective view of a schematic diagram of a connector assembly in accordance with embodiments of the present disclosure.

FIG. 5A is a perspective view of a schematic diagram of a connector assembly in accordance with embodiments of the present disclosure.

FIG. 9B is a schematic diagram of a connector assembly in connection with a substrate diving board in accordance with embodiments of the present disclosure.

DETAILED DESCRIPTION

This disclosure describes embodiments of a linear edge connector (LEC) assembly for connecting a cable bundle to a substrate diving board that can carry a central processing unit and/or other computer component. In some embodiments, a bolster plate can include structural elements to provide structural support for connecting the LEC assembly to substrate diving board. Embodiments of the disclosure are also directed to securing the cable bundle to the LEC with sufficient force to prevent LEC electrical failure through shipping vibration induced fretting.

Retention mechanisms can add to functionality of Linear Edge Connector for fabric version of server products. For edge connectors, fretting corrosion is a common issue caused by micro-movement of the connector contact tip relative to substrate diving board pad under shipping/operational shock and shipping vibration conditions. It is a potential risk for connector electrical performance.

Figure 1A:
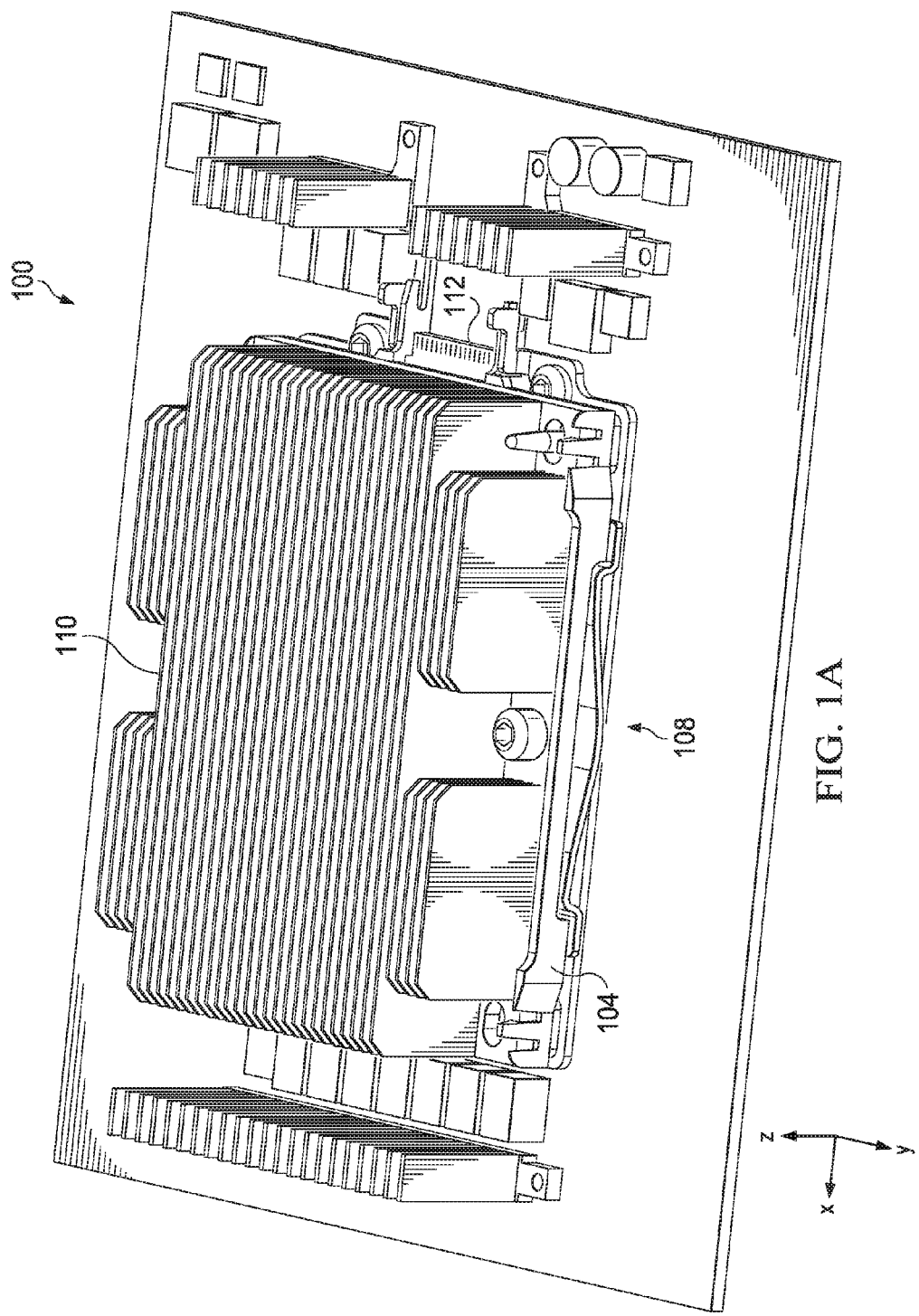
FIG. 1A is a schematic diagram of a central processing unit board that includes a substrate diving board in accordance with embodiments of the present disclosure.

FIG. 1A is a schematic diagram of a system 100 that includes a substrate diving board 112 and a bolster plate 104 in accordance with embodiments of the present disclosure. A substrate 108 (shown in FIG. 1B) can include a CPU (not shown) and secured by a Package Heatsink Loading Mechanism (PHLM) 107. The substrate 108 can include a substrate diving board 112 that provides an electrical interface to other computing or network elements. At the system stack level, the LEC assembly interacts with several key components in the system, e.g. substrate diving board 112 and bolster plate 104. The physical location of the interface between the LEC assembly and the substrate diving board is where dynamic (mechanical) inputs get magnified significantly. For example, in FIG. 1A, a substrate 108 is attached to a heat sink 110 (through the PHLM 107), which plays a big role in dynamic input. Also, to accommodate routing options for different system layouts and provide flexibility for customers, the cable bundle is not retained on the mother board which further magnifies the dynamic inputs on LEC assembly during shipping (shock and vibration).

Additionally, the plating on the substrate 108 that interfaces with LEC assembly contact is different from other typical edge connectors for other circuits. The package/LEC interface is subject to significant system dynamic inputs and is critical to HSIO signal integrity performance. Therefore, the connector assemblies described herein prevent micromotion/plating wear and fretting by actively retaining the connector with a retaining force (e.g., a force in the range of 3-9 lbf).

Figure 1B:
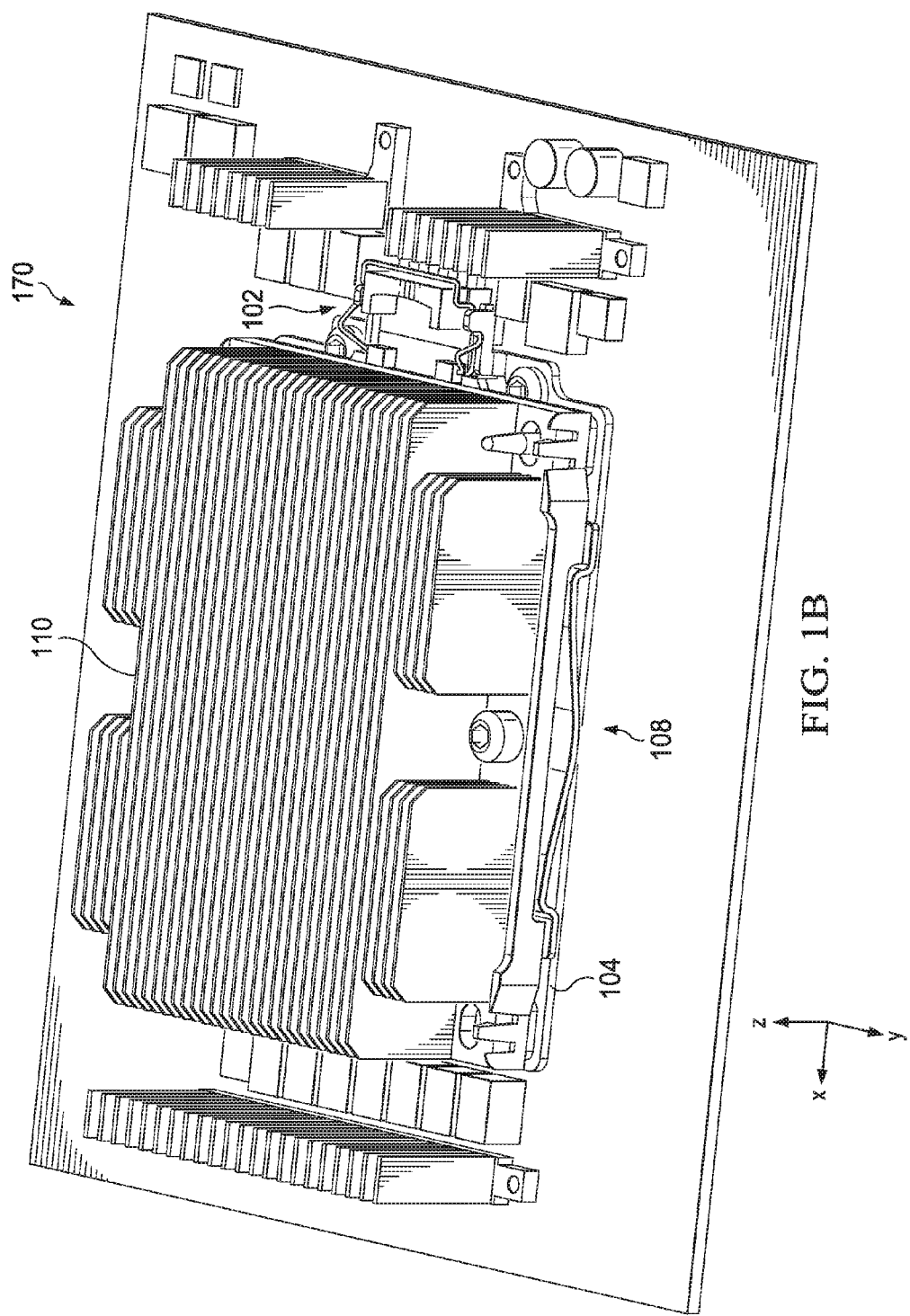
FIG. 1B is a schematic diagram of a central processing unit board that includes a linear edge connector assembly connected to a substrate diving board in accordance with embodiments of the present disclosure.

FIG. 1B is a schematic diagram 170 of a system that includes a substrate 108 and linear edge connector (LEC) assembly 102 in accordance with embodiments of the present disclosure. The linear edge connector (LEC) assembly 102 shown in FIG. 1D can be any of the connector assembly embodiments described herein. Of note in FIG. 1D is the limited clearance available for connecting the linear edge connector assembly to the bolster plate and substrate diving board. The design space for LEC is strictly constrained by the system layout to clear other components on the board and in the chassis compared to typical edge connectors. The form factor of the LEC assembly 102 can accommodate the small spaces available on the mother board 108. For example, the form factor of the LEC connector assembly 102 can be on the order of 20 mm W (y-direction), 11 mm Height (z-direction), and 35 mm depth (x-direction).

Figure 2:
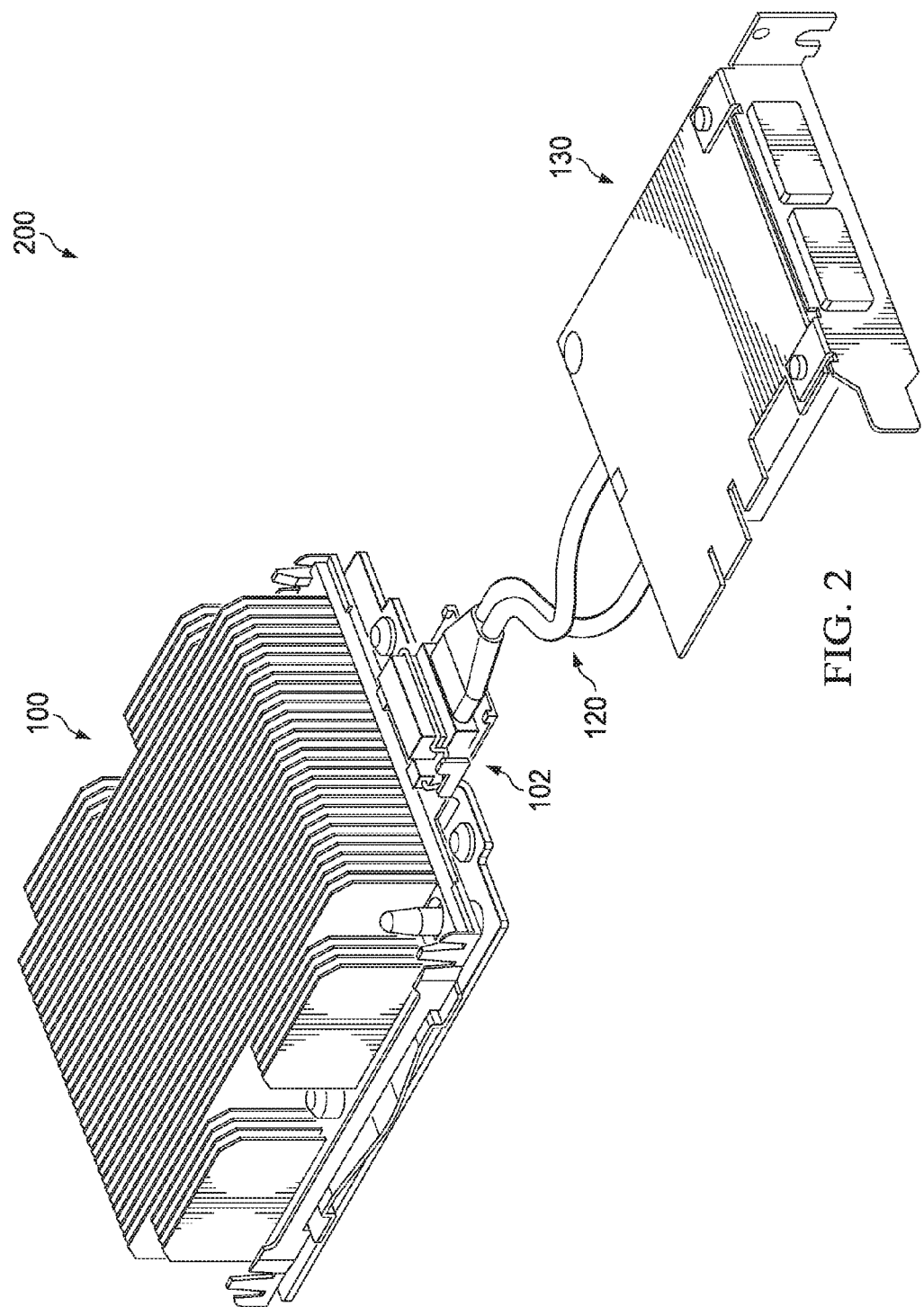
FIG. 2 is a schematic diagram of central processing unit board connected to another board by a cable assembly in accordance with embodiments of the present disclosure.

FIG. 2 is a schematic diagram of central processing unit board connected to another board by a cable assembly in accordance with embodiments of the present disclosure.

The aforementioned factors lay great challenges on LEC retention mechanism design to retain connector in place and prevent plating wear and fretting under use/shipping conditions. This disclosure describes embodiments for connector assemblies having the following general characteristics:

Each can lock the connector to a rigid component on the CPU package;

Each can constrain translation/rotation in all directions; and

Each includes an active retention force between package diving board and the connector assembly.

In embodiments, the connector assembly uses a latch mechanism that provides active retention force along mating direction by pushing the connector against the substrate. This prevents relative movement between the connector contacts and substrate, and hold the connector in place in the system stack-up.

The following retention mechanism designs are proposed here to solve the aforementioned fretting issue. Embodiments of this disclosure can be characterized by including bolster plate hard stop feature for retention of a connector assembly. Among the embodiments of this disclosure are:

1. Press fit ball retention mechanism design
2. Magnetic/Ferrous connector hard stop retention mechanism
3. Ball-track latch retention mechanism
4. Push-ball/Screw retention mechanism design FIG. 3A is a perspective view of a schematic diagram 300 of a bolster plate 302 in accordance with embodiments of the present disclosure. Bolster plate 302 can be similar to that of bolster plate 104 shown in FIG. 1A. The substrate diving board 322 can include electrical contacts for connecting electrical elements on the CPU package with external elements and/or devices through a connector assembly. The bolster plate 302 can include bolster plate arm 306 that can hold a bolster plate protrusion 308. FIG. 3A shows an example of a bolster plate protrusion 308 for receiving a connector assembly in accordance with embodiments of the present disclosure. FIG. 3A also shows the substrate diving board 322. The substrate diving board 322 includes one or more electrical contacts that electrically connect substrate elements (such as a CPU) to external elements, through the LEC assembly.

FIG. 3B is a perspective view of a bolster plate ball in accordance with embodiments of the present disclosure. Protrusion 308 can include a ball bearing or similar structure 312 housed in a housing 310. In some embodiments, the housing 310 can house a spring 314 (not shown) that pushes against the ball bearing 312. The ball bearing 312, thus, can be spring loaded in the housing 310. Bolster plate protrusion 308 can include a pin or ball bearing or other spherical or substantially spherical element that can be received by a connector assembly (as described further in the sections below). The bolster plate protrusion 308 can be located on a bolster plate arm 309 on the bolster plate 302. Bolster plate arm 306 can be a protrusion or stamped/inserted elongation extending from the bolster plate 302.

Embodiment 1. Press Fit Ball Retention Mechanism Design

FIG. 4A is a perspective view of a schematic diagram of a connector assembly 400 in accordance with embodiments of the present disclosure. The connector assembly 400 includes a connector body 402 and an electrical interface 404. Electrical interface 404 is configured to receive a linear edge connector (LED) that to electrically connect the contacts on the LEC 322 (of FIG. 3A) to wires 410 of the connector assembly 400.

The connector body 402 can reside between the electrical interface 404 and the wires 410, and can act as a strain relief for the wires 410. The connector body 402 can include a groove 406 configured to receive a bolster plate protrusion, such as the ball 312. The groove 406 includes a circular indentation 408. The groove 406 and indentation 408 can reside on both sides of the connector body 402. The spring 314 in the housing 310 can compress as the ball bearing 312 contacts the surface of the groove 406. The spring 314 can push the ball bearing 312 into the indentation 408, which can act as a locking mechanism to retain the connector assembly 400 onto the bolster plate.

The press fit ball 312 is spring loaded in the center and being utilized as locking feature on bolster plate 302. The corresponding groove features 406 on connector work with the press fit ball 312 to lock connector assembly 400 in place and provide movement constrains. Additionally, the groove 406 facilitates self-alignment of the connector assembly 400 to the LEC 322 of FIG. 3A.

Figure 4B:
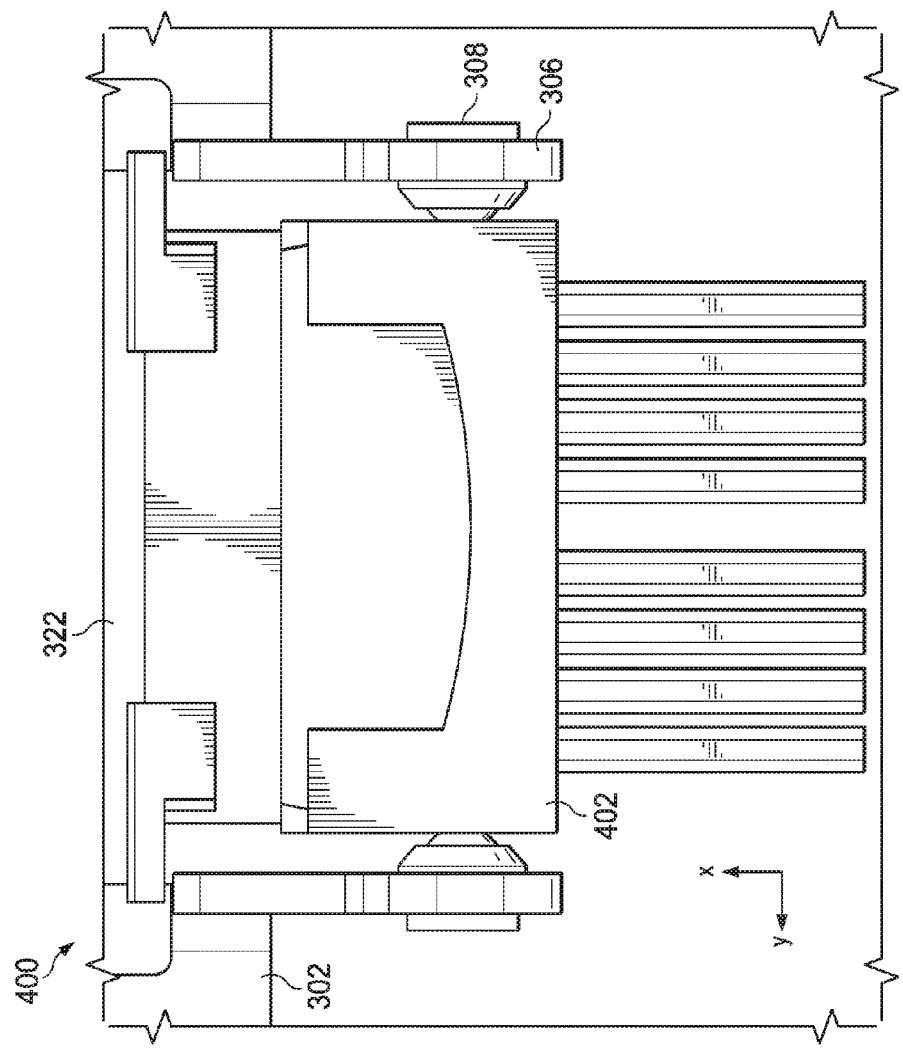
FIG. 4B is a schematic diagram of a connector assembly that is connected to a substrate diving board in accordance with embodiments of the present disclosure.

FIG. 4B is a schematic diagram of a connector assembly 400 that is connected to a substrate diving board 322 in accordance with embodiments of the present disclosure. The groove features 406 receive the bolster plate protrusion 308, which includes press fit ball 312 located on arm 306 of the bolster plate 302 and connect to two sides of the connector body 402. When the spring plunger press fit balls 312 go into the groove features 406, the spring loaded balls 312 compress the connector body 402 from two sides in width direction, and the connector assembly 400 will be locked in place and constrained.

FIG. 5A is a perspective view of a schematic diagram of a connector assembly 500 in accordance with embodiments of the present disclosure. Connector assembly 500 is similar to connector assembly 400. For example, connector assembly 500 includes an electrical interface 504 configured to receive a substrate diving board 322. The connector body 502 includes a groove 508 that can receive a press fit ball 312 and lock the ball 312 into an indentation 508.

The connector assembly 500 includes magnet 510. Magnet 510 can be over-molded in the connector body 502. The magnets 510 can lock the ball 312 in place through an attractive magnetic force. The strong magnet attractive force between the magnets 510 embedded and press fit ball 312 on bolster plate 302 can provide very good movement constrain under shipping/operational shock and vibration conditions.

In some embodiments, the press fit ball 312 is not spring loaded. The magnetic attraction can be sufficient to secure the connector assembly 500. The use of a spring loaded ball can add further compression.

The connector assembly 500 can include a slot 512 that creates a cavity between the magnet 510 and the side of the connector body 502. The slot 512 can receive a ferromagnetic element (shown in FIG. 5C) to block the magnetic field between the magnet 510 and the ball 312.

Figure 5B:
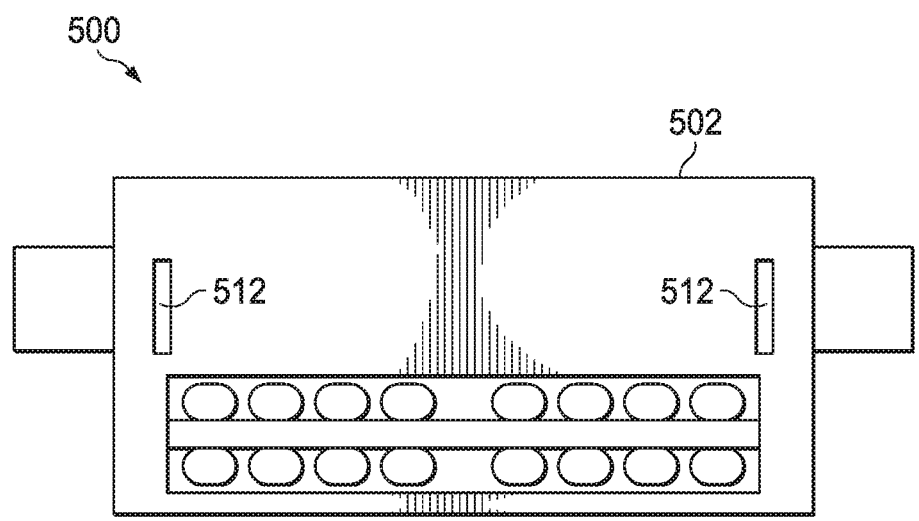
FIG. 5B is a rear view of a schematic diagram of an embodiment of a connector assembly in accordance with embodiments of the present disclosure.
Figure 5C:
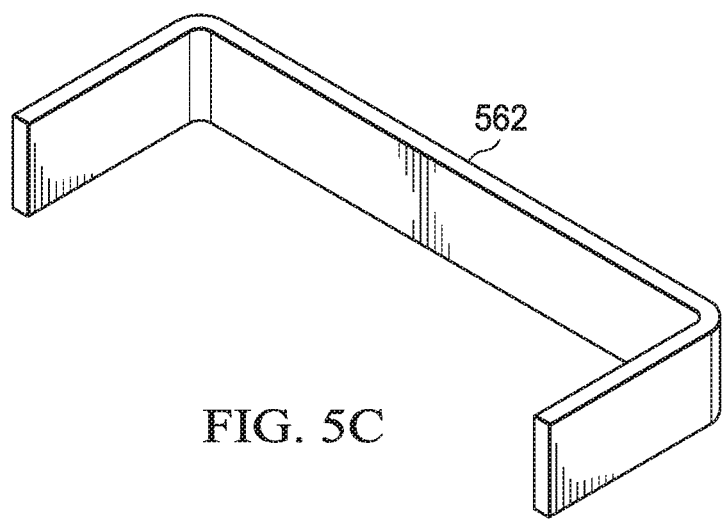
FIG. 5C is a schematic diagram of a ferromagnetic key in accordance with embodiments of the present disclosure.

FIG. 5B is a rear view of a schematic diagram of an embodiment of a connector assembly 500 in accordance with embodiments of the present disclosure. The connector body 502 backside includes slots 512. The slots 512 are on both sides of the connector body 502. FIG. 5C is a schematic diagram of a ferromagnetic key 562 in accordance with embodiments of the present disclosure. The ferromagnetic key 562 can have a "U" shaped body, with dimensions conforming to the slots 512 on the connector body 502. The "prongs" of the key 562 are long enough to block the magnetic field between the magnets 510 and the ball 312.

Figure 6A:
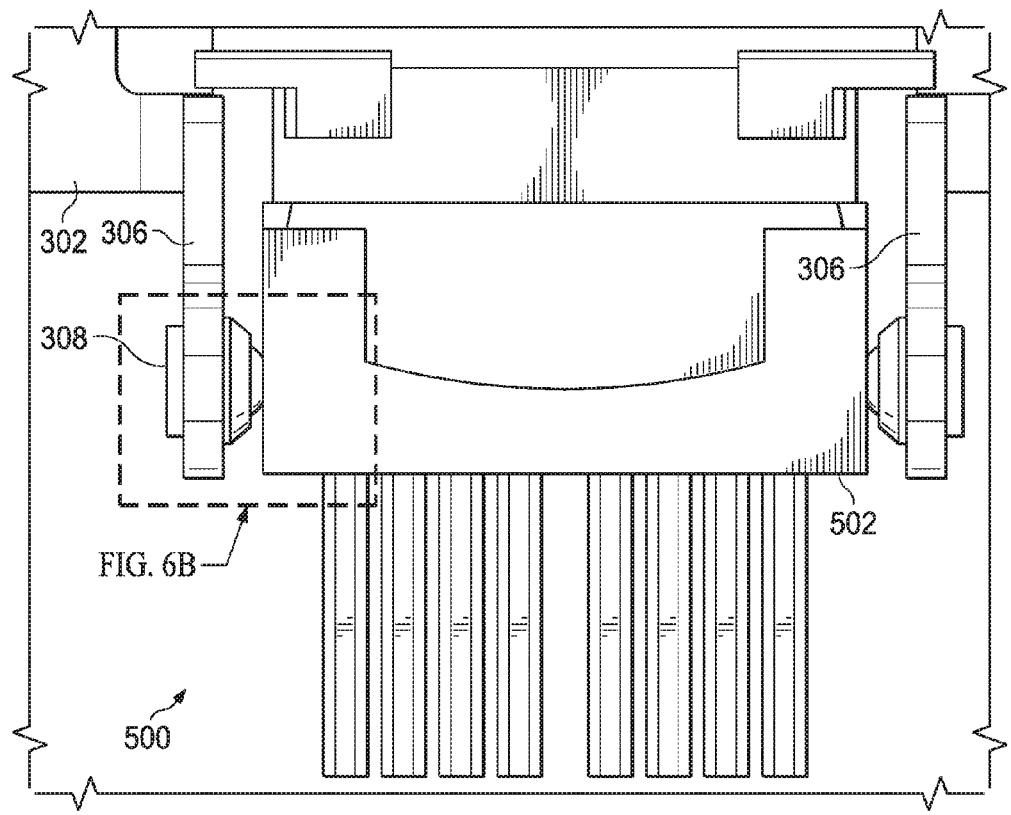
FIG. 6A is a schematic diagram of a connector assembly that is connected to a bolster plate in accordance with embodiments of the present disclosure.
Figure 6B:
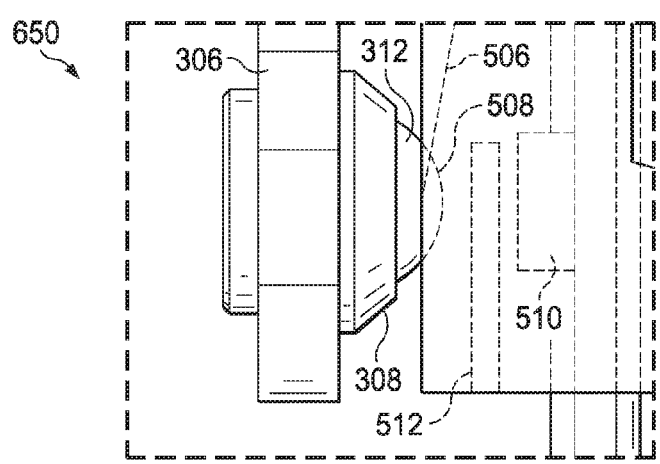
FIG. 6B is a close-up view of a bolster plate ball in contact with the connector assembly in accordance with embodiments of the present disclosure.

FIG. 6A is a schematic diagram 600 of a connector assembly 500 that is connected to a bolster plate 302 in accordance with embodiments of the present disclosure. FIG. 6B is a close-up view 650 of a bolster plate protrusion 308 in contact with the connector assembly 500 in accordance with embodiments of the present disclosure. The groove feature 506 receives the bolster plate protrusion 308, which includes the press fit ball 312 and is located on arm 306 of the bolster plate 302 and connect to two sides of the connector body 402. When the ball 312 fits into the groove feature 506 and the indentation 508, the press fit balls 312 compress the connector body 402 from two sides in width direction. The press fit ball 312 can then be received into the indentation 508. Indentation 508 is proximate to the magnet 510. When the ball 312 is received into the indentation 508, the magnetic attraction between the magnet 510 and the ball 312 can lock and constrain the connector assembly 500. The slot 512 in the connector body 502 creates a cavity between the magnet 510 and the ball 312. Absent the ferromagnetic key, the magnetic field created by the magnet 510 can secure the ball 312.

Figure 7A:
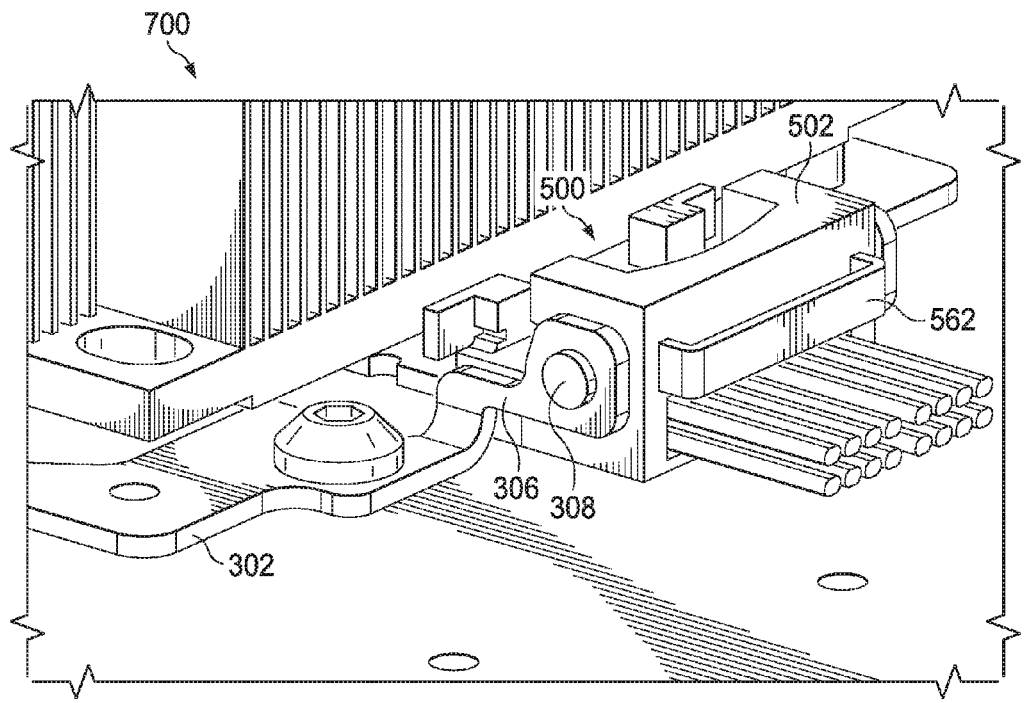
FIG. 7A is a schematic diagram of a connector assembly attached to a bolster playe in accordance with embodiments of the present disclosure.
Figure 7B:
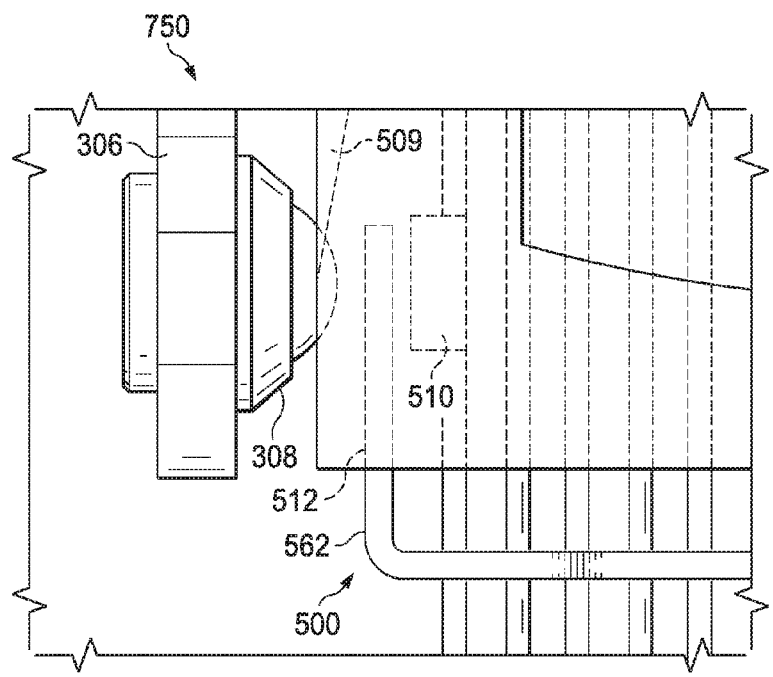
FIG. 7B a close-up view of a connector assembly connected to a bolster plate ball in accordance with embodiments of the present disclosure.

FIG. 7A is a schematic diagram 700 of a connector assembly 500 attached to a bolster plate 302 in accordance with embodiments of the present disclosure. FIG. 7B a close-up view 750 of a connector assembly 500 connected to a bolster plate protrusion 308 in accordance with embodiments of the present disclosure. The connector body 502 includes a ferromagnetic key 562 received within the slots 512. The ferromagnetic key 562 can block the magnetic field from the magnet 510, thereby permitting the connector to be removed without the counter active magnetic force. To remove the connector from assembly, a ferromagnetic key can be inserted into connector back-shell to block the magnetic field and release the magnet attraction force.

Embodiment 2. Ball-Track Latch Retention Mechanism

Figure 8:
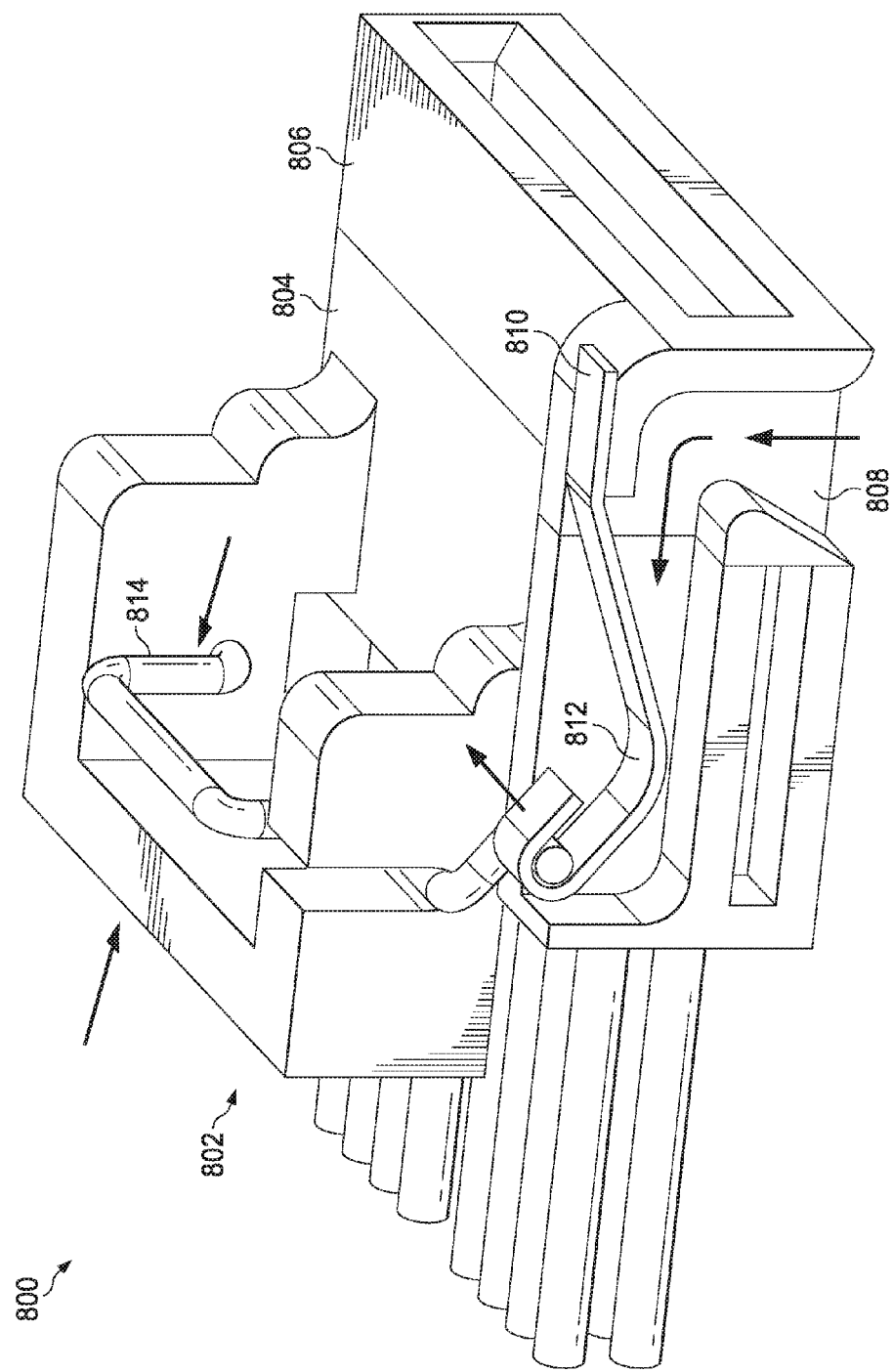
FIG. 8 is a schematic diagram of a connector assembly in accordance with embodiments of the present disclosure.

FIG. 8 is a schematic diagram of a connector assembly in accordance with embodiments of the present disclosure. The linear edge connector (LEC) assembly 802 includes a connector body 804 and an electrical interface 806. The connector body 804 and the electrical interface 806 include a plastic molded track system 808 incorporated on each side of the connector assembly 802. A stamped metal leaf spring 810 is incorporated into the track system 808. The track 808 and leaf spring 810 act as a guide while installing the connector 802. The leaf spring 810 snaps to the bolster-plate ball 312 when fully inserted to lock the connector 802 in place.

The bolster plate ball 312 can slide through the track system 808 during connection with the substrate diving board. Toward the end of travel, the ball 312 can overcome the arc-shape clamp feature 812 of leaf spring 812 and be locked in place at the end of the track system 808. Correspondingly, the connector 802 will be able to firmly grab on the ball features 312 and be locked to bolster plate. Since the bolster plate is a more rigid component in the stack-up and is part of the PHLM mechanism that the substrate is attached to, the movement of the connector 802 relative to substrate can be effectively controlled.

To release the connector 802 from the locked position, the connector assembly 802 includes a lever 814 connected to the leaf spring 810. The connector 802 is released from the bolster plate by pinching the lever 814 and connector body 802 together, thus disengaging the leaf spring 810 from the bolster plate ball 312. The connector can be slide backwards with less resistance.

Embodiment 3: Magnetic/Ferrous Connector Hard Stop Retention Mechanism

Figure 9A:
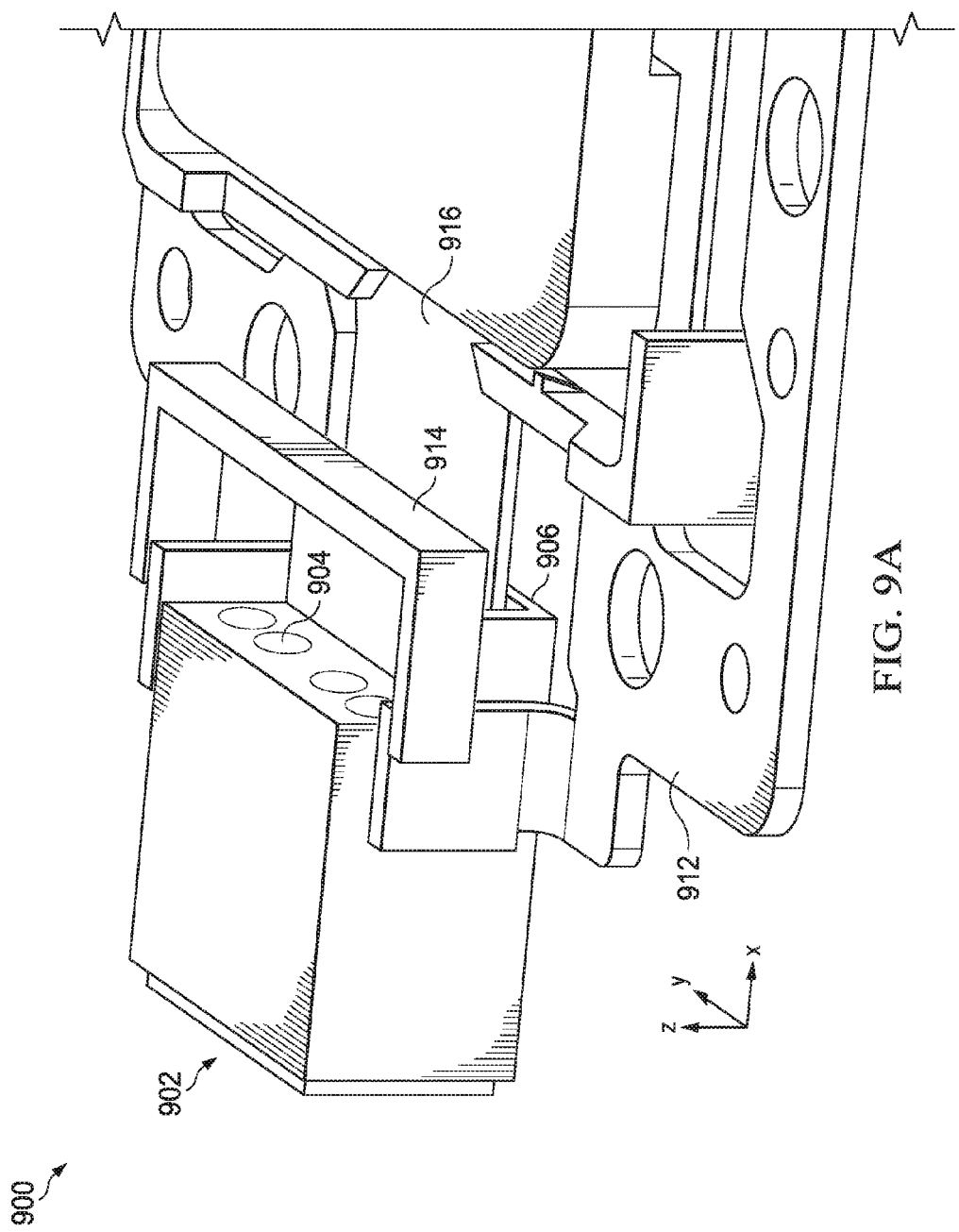
FIG. 9A is a schematic diagram of a connector assembly in accordance with embodiments of the present disclosure.

FIG. 9A is a schematic diagram of a connector assembly 900 in accordance with embodiments of the present disclosure. Connector assembly 902 includes magnetic rods 904 over molded in the connector body 902. The bolster plate includes magnetic/ferrous hard stop feature 914 on bolster plate 912 to lock the connector assembly 900 in place. The strong attraction force directly along connector/substrate mating direction (x-direction) will constrain connector movement under shock/vibration conditions.

FIG. 9B is a schematic diagram of a connector assembly 900 connected to a substrate diving board 916. A magnetic/ferrous hard stop feature 914 is incorporated in bolster plate 912. As the connector being plugged on the package substrate diving board 916, the attraction force between the magnetic strips 904 and the magnetic/ferrous hard stop feature 914 increases. As the distance between the connector and bolster plate hard stop feature further decreases, the connector 900 will automatically align with the magnetic/ferrous hard stop feature 914 due to the strong magnetic force (approximate 4.3 lbf).

Embodiment 4. Push-Ball/Screw Retention Mechanism Design

Figure 10A:
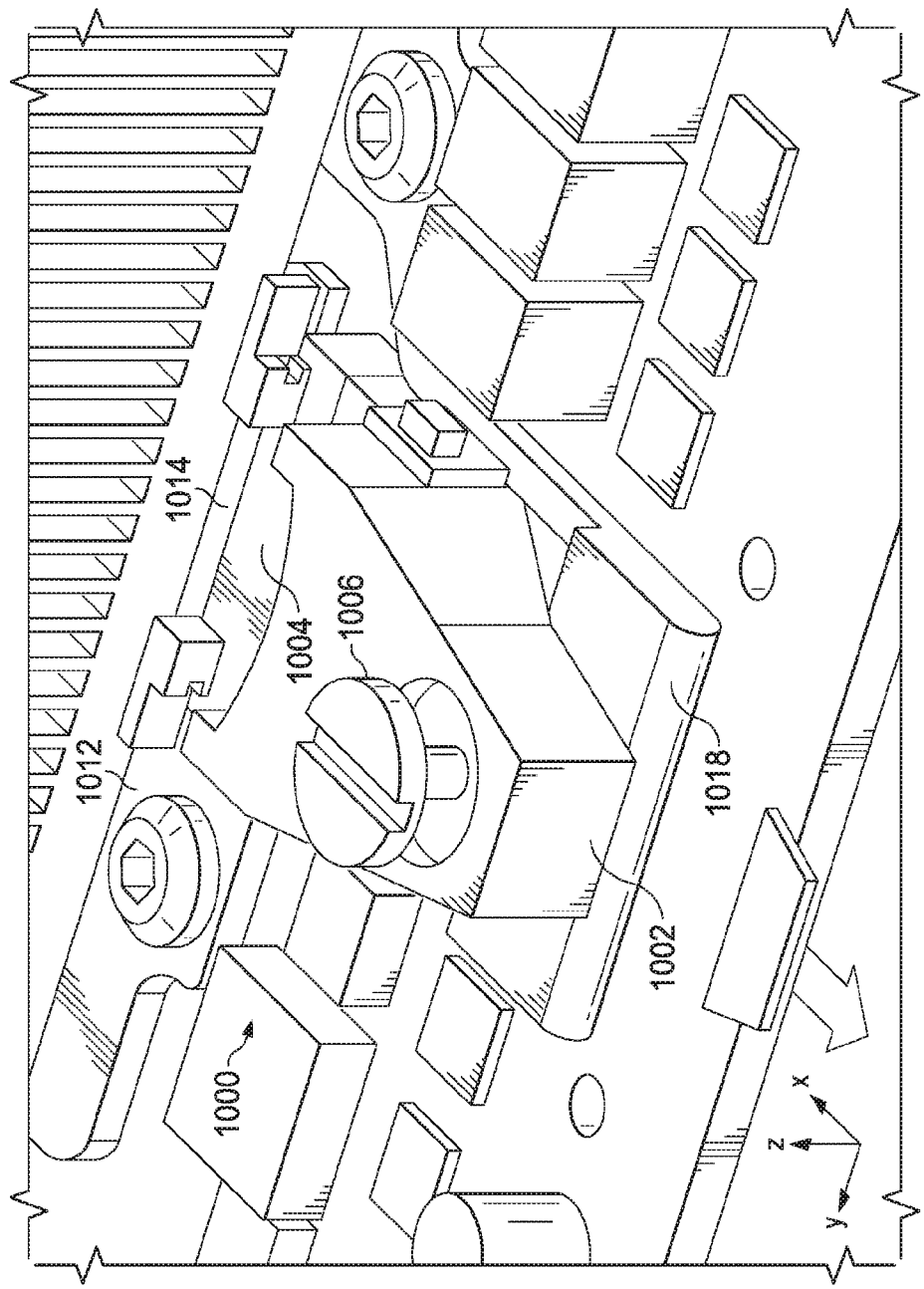
FIG. 10A is a schematic diagram of a connector assembly connected to a substrate diving board and bolster plate in accordance with embodiments of the present disclosure.

FIG. 10A is a schematic diagram of a connector assembly 1000 in accordance with embodiments of the present disclosure. The connector assembly 1000 can include a connector body 1002 and an electrical interface 1004. The electrical interface 1004 can receive a substrate diving board 1014 and electrically connect the contacts on the substrate diving board 1014 to conductors in a cable assembly. The connector body 1002 can include a retention slot through the connector body 1002. A press ball/screw 1006 can be pushed/screwed into the slots of connector body 1002 and a receiver plate 1018 of the bolster plate 1012 to retain the connector in place.

Figure 10B:
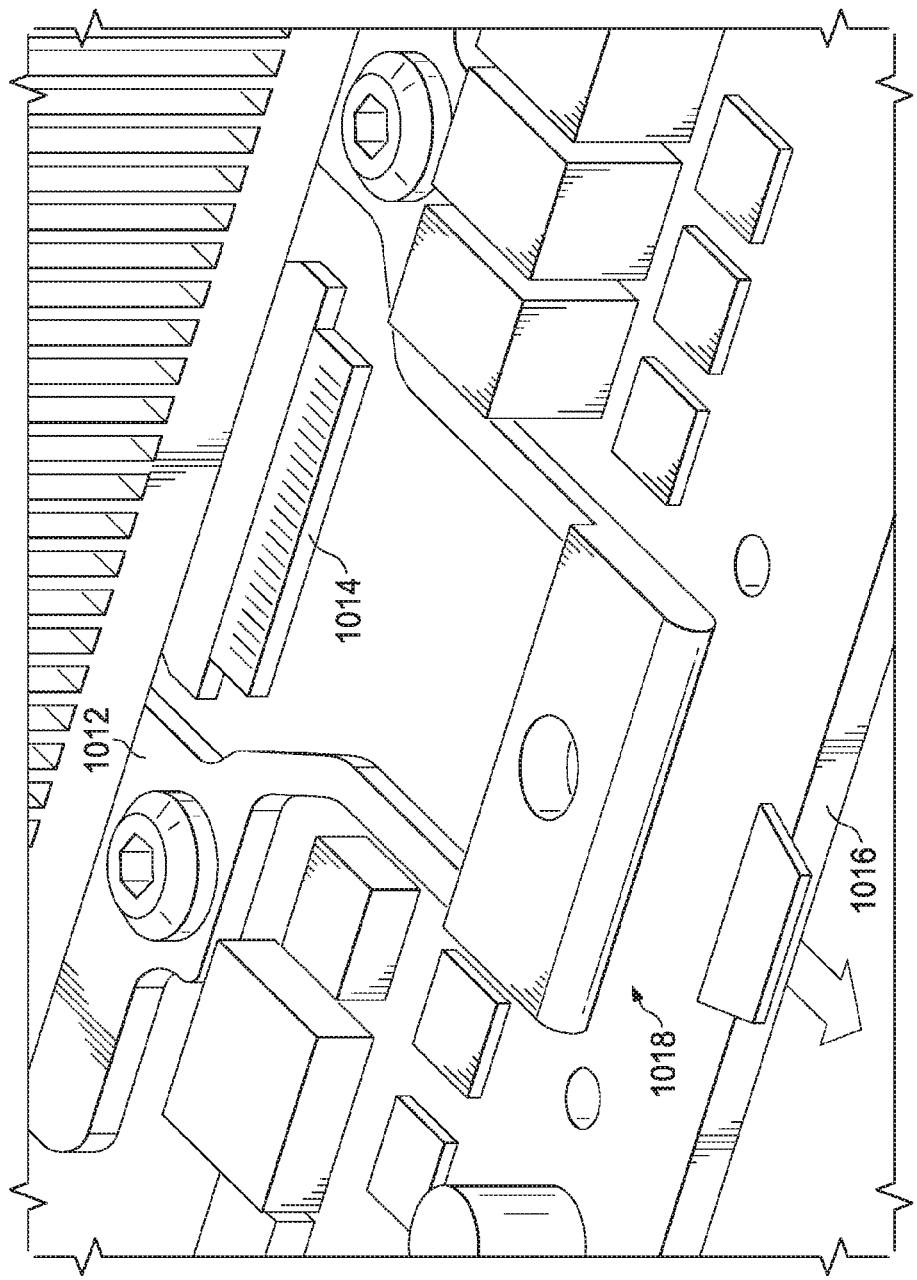
FIG. 10B is a schematic diagram of a bolster plate in accordance with embodiments of the present disclosure.

FIG. 10B is a schematic diagram of a bolster plate 1012 in accordance with embodiments of the present disclosure. To facilitate the movement constraint on the connector assembly 1000 of FIG. 10A, a push ball/screw retention slot 1016 is built into a receiving plate 1012 of the bolster plate 1012 located above the mother board. The retention slot 1016 can be aligned to receive the connection assembly push ball/screw 1006 and ensure that the electrical interface 1004 can receive the diving board 1014.

After engaging the connector with substrate diving board, the push-ball/screw 1006 can be pushed/screwed through the hole on connector body 1002 and lock the connector to the slot on bolster plate 1012. As mentioned before, by locking the connector assembly 1000 to the bolster plate 1012, the relative movement between substrate and connector can be well controlled.

By locking the connector firmly (relatively large contact area) to the bolster plate 1012, the push-ball retention mechanism can provide very good movement constraint on connector assembly 1000. The push-ball/screw retention mechanism can also help with strain relief under various cable use condition, e.g. in-plane bend, out-of-plane bend, etc, to isolate the connector inner feature to external load. By fixing the connector assembly 1000 to bolster plate 1012, the external load can be transferred to relative rigid bolster plate through push-ball mechanism so that the connector inner features, e.g., solder joints, contacts, etc. can be protected.

Figure 11:
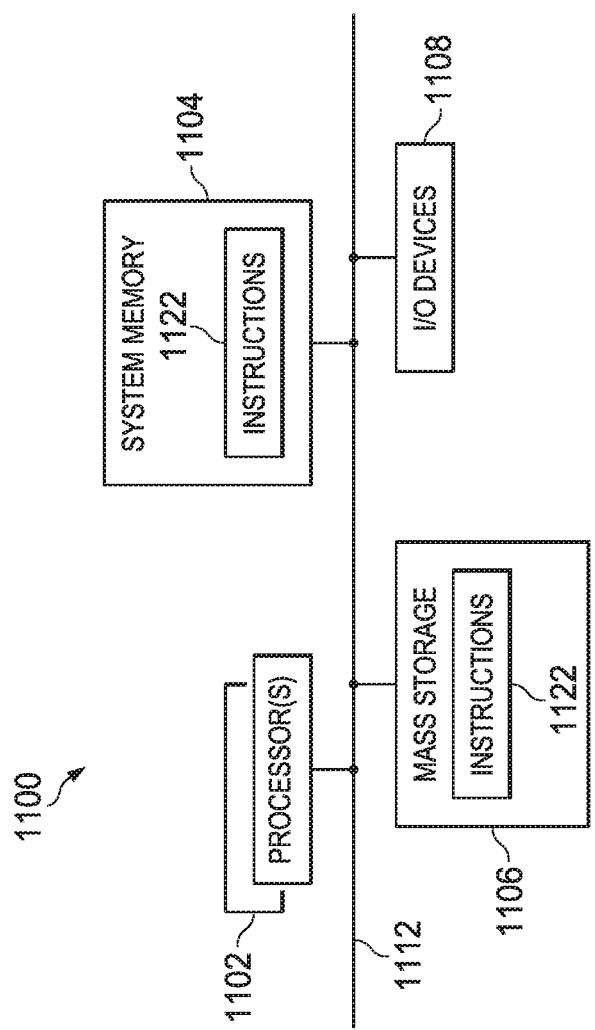
FIG. 11 is a block diagram of an example computing device that may connected via a linear edge connector

FIG. 11 is a block diagram of an example computing device 1100 that may connected via a linear edge connector. As shown, the computing device 1100 may include one or more processors 1102 (e.g., one or more processor cores implemented on one or more components) and a system memory 1104 (implemented on one or more components). As used herein, the term "processor" or "processing device" may refer to any device or portion of a device that processes electronic data from registers and/or memory to transform that electronic data into other electronic data that may be stored in registers and/or memory. The processor(s) 1102 may include one or more microprocessors, graphics processors, digital signal processors, crypto processors, or other suitable devices. More generally, the computing device 1100 may include any suitable computational circuitry, such as one or more Application Specific Integrated Circuits (ASICs).

The computing device 1100 may include one or more mass storage devices 1106 (such as flash memory devices or any other mass storage device suitable for inclusion in a flexible IC package). The system memory 1104 and the mass storage device 1106 may include any suitable storage devices, such as volatile memory (e.g., dynamic random access memory (DRAM)), nonvolatile memory (e.g., read-only memory (ROM)), and flash memory. The computing device 1100 may include one or more I/O devices 1108 (such as display, user input device, network interface cards, modems, and so forth, suitable for inclusion in a flexible IC device). The elements may be coupled to each other via a system bus 1112, which represents one or more buses.

Each of these elements may perform its conventional functions known in the art. In particular, the system memory 1104 and the mass storage device 1106 may be employed to store a working copy and a permanent copy of programming instructions 1122.

The permanent copy of the programming instructions 1122 may be placed into permanent mass storage devices 1106 in the factory or through a communication device included in the I/O devices 1108 (e.g., from a distribution server (not shown)). The constitution of elements 1102-1112 are known, and accordingly will not be further described.

Machine-accessible media (including non-transitory computer-readable storage media), methods, systems, and devices for performing the above-described techniques are illustrative examples of embodiments disclosed herein for a linear edge connector. For example, a computer-readable media (e.g., the system memory 1104 and/or the mass storage device 1106) may have stored thereon instructions (e.g., the instructions 1122) such that, when the instructions are executed by one or more of the processors 1102.

The relative sizes of features shown in the figures are not drawn to scale.

The following paragraphs provide examples of various ones of the embodiments disclosed herein.

Example 1 is a cable retention assembly including an electrical interface configured to receive a substrate diving board and electrically couple the substrate diving board with a conductor of a cable bundle, and a retention mechanism body coupled to the electrical interface, the retention mechanism body including a bolster plate receiving groove to receive a protrusion on a bolster plate, and a bolster plate receiving indentation to receive the bolster plate protrusion.

Example 2 may include the subject matter of example 1, wherein the bolster plate receiving indentation includes a circular indentation to receive a circular protrusion on the bolster plate.

Example 3 may include the subject matter of examples 1 or 2, wherein the retention mechanism body includes a magnetic element to magnetically couple the bolster plate protrusion to the retention mechanism body.

Example 4 may include the subject matter of example 3, wherein the retention mechanism body includes a backwall that includes a slot configured to receive a ferromagnetic rod, the slot defining a cavity between the magnetic element and the bolster plate receiving indentation.

Example 5 may include the subject matter of example 1, wherein the bolster plate protrusion includes a spring loaded ball bearing.

Example 6 is a cable retention assembly including an electrical interface configured to receive a substrate diving board and electrically couple the substrate diving board with a conductor of a cable bundle, and a retention mechanism body including a bolster plate receiving track to receive a protrusion on a bolster plate, and a leaf spring including a curved portion, the curved portion reducing a width of the track and configured to confine the bolster plate protrusion.

Example 7 may include the subject matter of example 6, further including a release spring coupled to the leaf spring, the release spring configured to apply a force on the leaf spring to release the bolster plate protrusion.

Example 8 may include the subject matter of example 7, wherein the release spring is configured to be squeezed against the retention mechanism body to release the bolster plate protrusion.

Example 9 is a cable retention assembly including an electrical interface configured to receive a substrate diving board and electrically couple the substrate diving board with a conductor of a cable bundle, and a retention mechanism body coupled to the electrical interface, the retention mechanism including a magnetic element residing within the retention mechanism body, the magnetic element configured to magnetically attract a magnetic hard stop feature on a bolster plate.

Example 10 may include the subject matter of example 9, the retention mechanism body includes a plurality of magnetic elements.

Example 11 may include the subject matter of any of examples 9 or 10, wherein the magnetic element is overmolded in the retention mechanism body.

Example 12 is a cable retention assembly including: an electrical interface configured to receive a substrate diving board and electrically couple the substrate diving board with a conductor of a cable bundle, and a retention mechanism body coupled to the electrical interface, the retention mechanism body including a pin received in a pin-hole, the pin configured to mate with a receiver on the bolster plate.

Example 13 may include the subject matter of example 12, wherein the pin includes a screw and the pin-hole includes threads to receive the screw, and wherein the receiver on the bolster plate includes threads to receive the screw.

Example 14 may include the subject matter of example 12, wherein the pin includes a push pin, and the pin-hole includes an unthreaded hole accommodating the push pin, and wherein the bolster plate receiver includes a friction fit receiver for the push pin.

Example 15 is a computing system including a central processing unit (CPU) residing on a substrate, the substrate including a diving board including contacts coupled to the CPU; a bolster plate mechanically connected the substrate, the bolster plate including a connector receiving element including a protrusion. The system may include a cable retention assembly including an electrical interface configured to receive the edge connector and electrically couple the edge connector to a wiring connector assembly, and a retention mechanism body coupled to the electrical interface, the retention mechanism body including a bolster plate receiving groove to receive a protrusion on a bolster plate, and a bolster plate receiving indentation to receive the bolster plate protrusion.

Example 16 may include the subject matter of example 15, wherein the bolster plate receiving indentation includes a circular indentation to receive a circular protrusion on the bolster plate.

Example 17 may include the subject matter of example 15, wherein the retention mechanism body includes a magnetic element to magnetically couple the bolster plate protrusion to the retention mechanism body.

Example 18 may include the subject matter of example 17, wherein the retention mechanism body includes a backwall that includes a slot configured to receive a ferromagnetic rod, the slot defining a cavity between the magnetic element and the bolster plate receiving indentation.

Example 19 may include the subject matter of example 15, wherein the bolster plate protrusion includes a spring loaded ball bearing.

Example 20 is a computing system including a central processing unit (CPU) residing on a circuit board, the circuit board including an edge connector electrically coupled to the CPU; a bolster plate mechanically connected the circuit board, the bolster plate including a connector receiving element including a protrusion; and a cable retention assembly. The cable retention assembly can include an electrical interface configured to receive an edge connector and electrically couple the edge connector with a wiring connector assembly, and a retention mechanism body including a bolster plate receiving track to receive a protrusion on a bolster plate, and a leaf spring including a curved portion, the curved portion reducing a width of the track and configured to confine the bolster plate protrusion.

Example 21 may include the subject matter of example 20, further including a release spring coupled to the leaf spring, the release spring configured to apply a force on the leaf spring to release the bolster plate protrusion.

Example 22 may include the subject matter of example 21, wherein the release spring is configured to be squeezed against the retention mechanism body to release the bolster plate protrusion.

Example 23 is a computing system including a central processing unit (CPU) residing on a circuit board, the circuit board including an edge connector electrically coupled to the CPU; a bolster plate mechanically connected the circuit board, the bolster plate including a connector receiving element including a protrusion; and a cable retention assembly. The cable retention assembly can include an electrical interface configured to receive an edge connector and electrically couple the edge connector with a wiring connector assembly, and a retention mechanism body coupled to the electrical interface, the retention mechanism including a magnetic element residing within the retention mechanism body, the magnetic element configured to magnetically attract a magnetic hard stop feature on a bolster plate.

Example 24 may include the subject matter of example 23, the retention mechanism body includes a plurality of magnetic elements.

Example 25 may include the subject matter of examples 23 or 24, the magnetic element is over-molded in the retention mechanism body.

Example 26 is computing system including a central processing unit (CPU) residing on a circuit board, the circuit board including an edge connector electrically coupled to the CPU; a bolster plate mechanically connected the circuit board, the bolster plate including a connector receiving element including a protrusion; and a cable retention assembly. The cable retention assembly can include an electrical interface configured to receive an edge connector and electrically couple the edge connector with a wiring connector assembly, and a retention mechanism body coupled to the electrical interface, the retention mechanism body including a pin received in a pin-hole, the pin configured to mate with a receiver on the bolster plate.

Example 27 may include the subject matter of example 26, wherein the pin includes a screw and the pin-hole includes threads to receive the screw, and wherein the receiver on the bolster plate includes threads to receive the screw.

Example 28 may include the subject matter of example 26, wherein the pin includes a push pin, and the pin-hole includes an unthreaded hole accommodating the push pin, and wherein the bolster plate receiver includes a friction fit receiver for the push pin.

What is claimed is:

1. A cable retention assembly comprising:
   an electrical interface configured to receive a substrate diving board and electrically couple the substrate diving board with a conductor of a cable bundle, and
   a retention mechanism body coupled to the electrical interface, the retention mechanism body comprising:
   a bolster plate receiving groove to receive a protrusion on a bolster plate, and
   a bolster plate receiving indentation to receive the bolster plate protrusion.

2. The cable retention assembly of claim 1, wherein the bolster plate receiving indentation comprises a circular indentation to receive a circular protrusion on the bolster plate.

3. The cable retention assembly of claim 1, wherein the retention mechanism body comprises a magnetic element to magnetically couple the bolster plate protrusion to the retention mechanism body.

4. The cable retention assembly of claim 3, wherein the retention mechanism body comprises a backwall that comprises a slot configured to receive a ferromagnetic rod, the slot defining a cavity between the magnetic element and the bolster plate receiving indentation.

5. The cable retention assembly of claim 1, wherein the bolster plate protrusion comprises a spring loaded ball bearing.

6. A computing system comprising:
- a central processing unit (CPU) residing on a substrate, the substrate comprising a diving board comprising contacts coupled to the CPU;
- a bolster plate mechanically connected the substrate, the bolster plate comprising a connector receiving element comprising a protrusion; and
- a cable retention assembly comprising:
    - an electrical interface configured to receive the edge connector and electrically couple the edge connector to a wiring connector assembly, and
    - a retention mechanism body coupled to the electrical interface, the retention mechanism body comprising:
        - a bolster plate receiving groove to receive a protrusion on a bolster plate, and
        - a bolster plate receiving indentation to receive the bolster plate protrusion.

7. The computing system of claim 6, wherein the bolster plate receiving indentation comprises a circular indentation to receive a circular protrusion on the bolster plate.

8. The computing system of claim 6, wherein the retention mechanism body comprises a magnetic element to magnetically couple the bolster plate protrusion to the retention mechanism body.

9. The computing system of claim 8, wherein the retention mechanism body comprises a backwall that comprises a slot configured to receive a ferromagnetic rod, the slot defining a cavity between the magnetic element and the bolster plate receiving indentation.

10. The computing system of claim 6, wherein the bolster plate protrusion comprises a spring loaded ball bearing.

11. A linear edge connector comprising:
- a printed circuit board comprising an electrical connection diving board;
- a bolster plate mechanically connected to the printed circuit board, the bolster plate comprising a connector receiving element comprising a protrusion; and
- a cable retention assembly comprising:
    - an electrical interface configured to receive the edge connector and electrically couple the edge connector to a wiring connector assembly, and
    - a retention mechanism body coupled to the electrical interface, the retention mechanism body comprising:
        - a bolster plate receiving groove to receive a protrusion on a bolster plate, and
        - a bolster plate receiving indentation to receive the bolster plate protrusion.

12. The linear edge connector of claim 11, wherein the bolster plate receiving indentation comprises a circular indentation to receive a circular protrusion on the bolster plate.

13. The linear edge connector of claim 11, wherein the retention mechanism body comprises a magnetic element to magnetically couple the bolster plate protrusion to the retention mechanism body.

14. The linear edge connector of claim 13, wherein the retention mechanism body comprises a backwall that comprises a slot configured to receive a ferromagnetic rod, the slot defining a cavity between the magnetic element and the bolster plate receiving indentation.

15. The linear edge connector of claim 11, wherein the bolster plate protrusion comprises a spring loaded ball bearing.

16. The linear edge connector of claim 11, further comprising a package heatsink loading mechanism coupled to the bolster plate.

17. The linear edge connector of claim 16, further comprising a heatsink coupled to the package heatsink loading mechanism.

\* \* \* \* \*